(12) United States Patent
Senda et al.

(10) Patent No.: US 9,051,645 B2
(45) Date of Patent: Jun. 9, 2015

(54) BARRIER FILM FOR SEMICONDUCTOR WIRING, SINTERED COMPACT SPUTTERING TARGET AND METHOD OF PRODUCING THE SPUTTERING TARGET

(75) Inventors: Shinichiro Senda, Ibaraki (JP);
Yasuhiro Yamakoshi, Ibaraki (JP);
Junichi Ito, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 187 days.

(21) Appl. No.: 13/059,582

(22) PCT Filed: Apr. 5, 2010

(86) PCT No.: PCT/JP2010/056152
§ 371 (c)(1),
(2), (4) Date: Mar. 9, 2011

(87) PCT Pub. No.: WO2010/119785
PCT Pub. Date: Oct. 21, 2010

(65) Prior Publication Data
US 2011/0155570 A1    Jun. 30, 2011

(30) Foreign Application Priority Data

Apr. 17, 2009 (JP) ................................. 2009-100666

(51) Int. Cl.
| C23C 14/34 | (2006.01) |
| C22C 1/04 | (2006.01) |
| C23C 14/16 | (2006.01) |
| H01J 37/34 | (2006.01) |
| H01L 21/285 | (2006.01) |
| H01L 21/768 | (2006.01) |

(52) U.S. Cl.
CPC ............ *C23C 14/3414* (2013.01); *C22C 1/045* (2013.01); *C23C 14/165* (2013.01); *H01J 37/3414* (2013.01); *H01J 37/3426* (2013.01); *H01L 21/2855* (2013.01); *H01L 21/76843* (2013.01)

(58) Field of Classification Search
USPC .......................................................... 75/246
See application file for complete search history.

(56) References Cited

U.S. PATENT DOCUMENTS

| 3,116,146 A | * | 12/1963 | Gatti ................................. 419/47 |
| 3,963,455 A | * | 6/1976 | Nobel et al. .................. 428/665 |
| 3,979,209 A | * | 9/1976 | Snyder, Jr. ...................... 419/39 |
| 6,328,927 B1 | * | 12/2001 | Lo et al. ........................ 419/45 |
| 6,815,357 B2 | | 11/2004 | Homma et al. |
| 7,605,481 B2 | | 10/2009 | Yamakoshi et al. |
| 7,618,505 B2 | | 11/2009 | Yamakoshi et al. |
| 7,718,117 B2 | | 5/2010 | Watanabe et al. |
| 7,740,718 B2 | | 6/2010 | Yamakoshi et al. |
| 7,956,464 B2 | * | 6/2011 | Kim et al. .................... 257/751 |

| 2003/0025202 A1 | | 2/2003 | Mikagi et al. |
| 2003/0035977 A1 | * | 2/2003 | Datta ............................ 428/675 |
| 2006/0037680 A1 | | 2/2006 | Yamakoshi |
| 2009/0022614 A1 | | 1/2009 | Sawada et al. |
| 2009/0189229 A1 | * | 7/2009 | Baek et al. ..................... 257/412 |

FOREIGN PATENT DOCUMENTS

| EP | 0496637 A2 | 7/1992 |
| JP | 58-144401 A | 8/1983 |
| JP | 02-163337 A | 6/1990 |
| JP | H06-283623 A | 10/1994 |
| JP | 11-200025 A | 7/1999 |
| JP | 2000-169923 A | 6/2000 |
| JP | 2000-306863 A | 11/2000 |
| JP | 2003-031576 A | 1/2003 |
| JP | 2003-049264 A | 2/2003 |
| JP | 2003-064440 A | 3/2003 |

OTHER PUBLICATIONS

AE Kaloyeros et al, one page Abstract of publication titled "Ultrathin Diffusion Barriers/Liners for Gigascale Copper Metallization", Annual Review of Materials Science, vol. 30, pp. 363-385, 2000 (month unknown).

M.F. Zhu et al., one page Abstract of publication titled "Amorphous Ni-N-W Film as a Diffusion Barrier between Aluminum and Silicon", Thin Film Solids, vol. 130, Nos. 3-4, pp. 245-251, Aug. 30, 1985.

A. Kawashima et al., one page Abstract of publication titled "Characterization of Sputter-Deposited Ni-Mo and Ni-W alloy Electrocatalysts for Hydrogen Evolution in Alkaline Solution", Materials Science and Engineering A, vols. 226-228, pp. 905-909, Jun. 1, 1997.

* cited by examiner

*Primary Examiner* — Jessee Roe
*Assistant Examiner* — Christopher Kessler
(74) *Attorney, Agent, or Firm* — Howson & Howson LLP

(57) ABSTRACT

Provided are a barrier film for a semiconductor wiring containing Ni with its remainder being W and unavoidable impurities and having a composition of WxNiy ($70 \leq x \leq 90$, $10 \leq y \leq 30$ unit: atomic percent), and a sintered compact sputtering target for forming a barrier film for a semiconductor wiring containing Ni with its remainder being W and unavoidable impurities and having a composition of WxNiy ($70 \leq x \leq 90$, $10 \leq y \leq 30$, unit: atomic percent), and comprising a target structure configured from a W matrix and Ni particles existing therein and in which W is diffused in the Ni particles. The present invention aims to provide a sputtering target that is particularly effective for use in forming a barrier film in which the target itself has the same composition as the barrier film without depending on the nitriding reaction in the sputtering process, which is capable of effectively preventing the reaction of a semiconductor device, which is free from the generation of particles in the sputtering process, and which yields superior characteristics upon forming the barrier film, as well as a method of producing such a target.

14 Claims, 5 Drawing Sheets

BARRIER FILM FOR SEMICONDUCTOR WIRING, SINTERED COMPACT SPUTTERING TARGET AND METHOD OF PRODUCING THE SPUTTERING TARGET

BACKGROUND OF THE INVENTION

The present invention relates to a barrier film for a semiconductor wiring, a sintered compact sputtering target, and a method of producing a sputtering target, and, for example, can be used for forming a barrier film that functions as a reaction prevention layer of a semiconductor device.

BACKGROUND ART

Generally, upon forming a copper wiring on a semiconductor element or an insulation film, if the copper wiring is directly formed on the element, the copper will diffuse in the semiconductor element (silicon) or the insulation film and impair the semiconductor properties. Thus, a diffusion barrier film is formed in advance and a copper wiring is thereafter formed. Tantalum or tantalum nitride is generally used as the diffusion barrier film of the copper wiring of the semiconductor element.

For example, this is performed by depositing tantalum or tantalum nitride by sputtering a high purity tantalum target and forming a diffusion barrier film at the concave part of a groove to which the copper wiring is to be formed, subsequently depositing a seed layer made of copper or copper alloy via sputtering, and ultimately embedding copper based on electroplating.

Meanwhile, the wiring width of semiconductor elements is being demanded of even narrower width pursuant to higher densification, and the performance of the barrier film is also being demanded. Under the foregoing circumstances, a barrier film of tantalum silicon nitride has been proposed (refer to Patent Document 1).

In the foregoing case, a target having tantalum silicide as its main component is prepared in advance, and this is subject to reactive sputtering in a nitrogen atmosphere to perform nitriding in order to form a barrier film of tantalum silicon nitride. However, there is a problem in that there is variation in the properties of the formed nitride film since this technology depends on the nitriding reaction in the sputtering process.

Moreover, reduction of the foregoing conditions requires complicated processes of strictly adjusting the sputtering conditions; for instance, it is necessary to strictly adjust the composition ratio of the target, adjust the ratio with sputter gas such as nitrogen and argon and introduce a constant amount thereof into the sputter device, adjust the substrate temperature.

In light of the above, although the development of a sputtering target material for reliably forming a barrier film is required, there was a problem in that the selection of the target material and the production method for improving the quality were not necessarily sufficient (refer to Patent Document 1). In addition, a high melting point metal-boron-based (boric) diffusion barrier has also been proposed (refer to Non-Patent Document 1).

The wiring width of semiconductor elements is becoming even narrower pursuant to higher densification and a ternary barrier film of Ta—Si—B or the like with high barrier properties and low resistance is also being considered. Here, it is considered that a large amount of tantalum as the metal component should be contained in order to achieve lower resistance and a small amount of boron should be added in order to improve the high temperature stability. However, even if a mixed powder of tantalum powder, silicon powder and boron powder is sintered via hot press or HIP, it was not possible to sufficiently improve the density, and the obtained product could not be used as a sputtering target.

In addition, there are patent documents that describe production methods of adding nickel to tungsten (refer to Patent Documents 2, 3, and 4). Although these patent documents do not disclose the functions as the barrier film and the method of preparing the same since they have different intended uses, these documents are listed by way of reference.

[Patent Document 1] Japanese Published Unexamined Patent Application No. H11-200025
[Patent Document 2] Japanese Published Unexamined Patent Application No. S58-144401
[Patent Document 3] Japanese Published Unexamined Patent Application No. H2-163337
[Patent Document 4] Japanese Published Unexamined Patent Application No. 2003-64440
[Non-Patent Document 1] Kaloyeros A E, Eisenbraun E, "Ultrathin diffusion barriers/liners for gigascale copper metallization" Annu Rev Mater Sci, Vol. 30, Pages 363 to 385 (2000)

SUMMARY OF THE INVENTION

In order to solve the foregoing problems, an object of this invention is to provide a sputtering target that is particularly effective for use in forming a barrier film in which the target itself has the same composition as the barrier film without depending on the nitriding reaction in the sputtering process, which is capable of effectively preventing the reaction of a semiconductor device, which is free from the generation of particles in the sputtering process, and which yields superior characteristics upon forming the barrier film, and a method of producing such a target.

In order to achieve the foregoing object, the present invention provides:

1) A barrier film for a semiconductor wiring containing Ni with its remainder being W and unavoidable impurities and having a composition of WxNiy ($70 \leq x \leq 90$, $10 \leq y \leq 30$ unit: atomic percent). Note that x+y=100% (unit: atomic percent; at % hereinafter).

2) A sintered compact sputtering target for forming a barrier film for a semiconductor wiring containing Ni with its remainder being W and unavoidable impurities and having a composition of WxNiy ($70 \leq x \leq 90$, $10 \leq y \leq 30$), and comprising a target structure configured from a W matrix and Ni particles existing therein and in which W is diffused in the Ni particles.

3) The sintered compact sputtering target according to 2) above, wherein the sputtering target comprises a W matrix, and Ni particles of 2 to 40 μm are dispersed in the W matrix.

4) The sintered compact sputtering target according to 3) above, wherein Ni particles of 2 to 5 μm and Ni particles of 20 to 40 μm are dispersed in the W matrix.

5) The sintered compact sputtering target according to 3) or 4) above, wherein the Ni particles existing in the W matrix are WNi particles.

6) The sintered compact sputtering target according to any one of 2) to 5) above comprising a purity of 4N5 or higher excluding gas components.

7) The sintered compact sputtering target according to 6) above, wherein oxygen as a gas component is 1000 wtppm or less and carbon as a gas component is 50 ppm or less.

8) The sintered compact sputtering target according to 7) above, wherein oxygen as a gas component is 500 wtppm or less.

9) The sintered compact sputtering target according to any one of 2) to 8) above, wherein the relative density is 95.0% or higher.

10) A method of producing a sputtering target, wherein W powder having an average particle size of 1 to 5 µm and Ni powder having an average particle size of 1 to 30 µm are mixed to achieve a compounding ratio, blending ratio, or mixing ratio of WxNiy (70≤x≤90, 10≤y≤30), and this is sintered based on hot press at a pressure, sintering pressure, or welding pressure of 10 to 50 MPa and at the temperature of 1300 to 1600° C.

The present invention yields a superior effect of being able to obtain a sputtering target in which the target itself has the same composition as the barrier film without depending on the nitriding reaction in the sputtering process, which is capable of effectively preventing the reaction of a semiconductor device, which is free from the generation of particles in the sputtering process, and, for example, which is particularly effective for use in forming a barrier film, as well as a method of producing such a target and the foregoing barrier film.

DETAILED DESCRIPTION OF THE INVENTION

Figure 1:
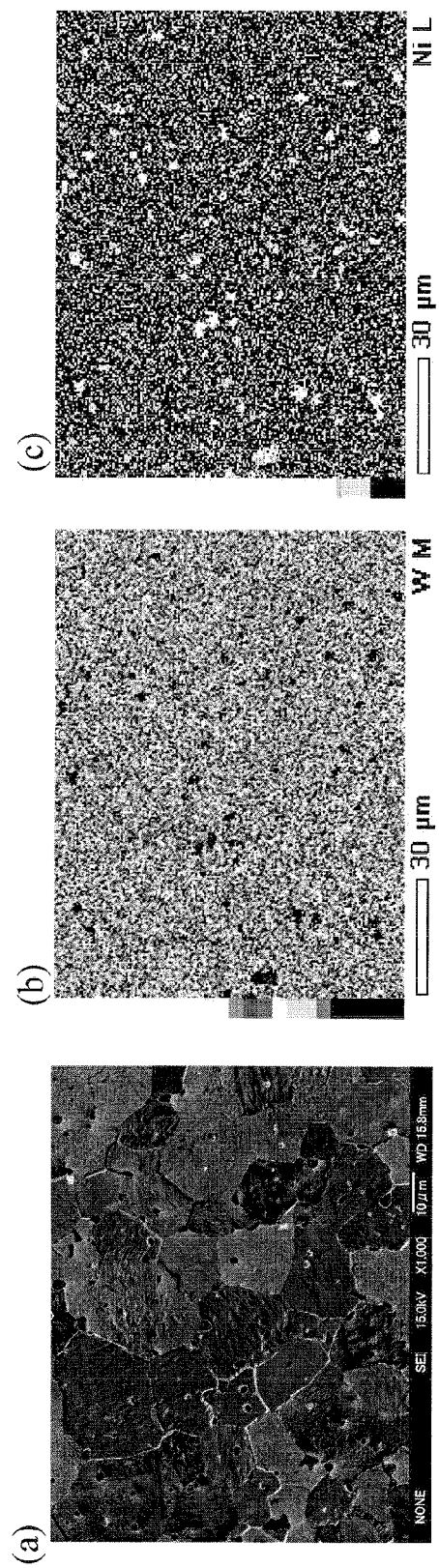
FIG. 1 An SEM image of a W-10 at % Ni target surface, wherein (a) is an SEM image of a W—Ni sintered compact surface (polished surface), (b) is a mapping image of W based on EDX (energy dispersion X-ray spectrometry) in the same visual field, and (c) is a mapping image of Ni based on EDX in the same visual field.

The sputtering target for forming the barrier film of the present invention can be produced by mixing W powder having an average particle size of 1 to 5 µm and Ni powder having an average particle size of 1 to 30 µm to achieve a compounding ratio, blending ratio, or mixing ratio of WxNiy (70≤x≤90, 10≤y≤30, unit: atomic percent), and sintering this based on hot press at a pressure, sintering pressure, or welding pressure of 10 to 50 MPa and temperature of 1300 to 1600° C. These sintering conditions are the conditions for obtaining a sintered compact sputtering target having a composition of WxNiy (70≤x≤90, 10≤y≤30, unit: at %), and comprising a structure configured from a W matrix and Ni particles existing therein and in which W is diffused in the Ni particles. If this target can be obtained, there is no particular limitation to the production method. For example, the W powder and the Ni powder may have an average particle size that is different from the foregoing conditions. Nevertheless, the intended target can be efficiently obtained by using the powders having the foregoing particle size.

The reason why WxNiy (70≤x≤90, 10≤y≤30) is required in the sintered compact sputtering target for forming the foregoing barrier film for a semiconductor wiring made of W, Ni and unavoidable impurities is as follows:

If Ni exceeds 30 (y>30), it is difficult to generate plasma in the sputtering process due to the magnetic properties of Ni, and efficient sputtering cannot be performed. But, if y is less than 10, the plating properties and adhesiveness will deteriorate. Thus, 10≤y is used.

Here, if the Ni amount in the W is a trace amount, the plating properties and adhesiveness tend to deteriorate even if the barrier properties based on the W—Ni alloy are favorable. Thus, in the foregoing case, this problem can be solved by devising the plating method such as substituting the plating method with an electroless plating method and adopting the ion beam deposition method, sputtering method or the like. From the perspective of the plating properties and adhesiveness of the barrier film, the Ni amount in W is more preferably 20 to 30 (20≤y≤30). Here, favorable plating properties can be obtained even with the electroless plating method.

The most important aspect is whether a material comprises favorable barrier properties or not. The barrier film for a semiconductor wiring of the present invention having a composition of WxNiy (70≤x≤90, 10≤y≤30) yields a superior effect of effectively preventing copper from diffusing in the semiconductor element (silicon) or the insulation film, and eliminate factors that impair the semiconductor properties.

The sintered compact sputtering target comprises several features, and one of these features is that the matrix of the sputtering target is W and Ni particles of 2 to 40 µm are uniformly dispersed in the W matrix.

Although W itself is crystallized in the sintering process, Ni particles of 2 to 5 µm exist at a triple point of the W crystals, and Ni of the other excess portions is uniformly dispersed in the W matrix as particles of 20 to 40 µm. Accordingly, when viewed on the whole, Ni particles of 2 to 40 µm are uniformly dispersed in the W matrix, but when viewed individually, Ni particles of 2 to 5 µm and Ni particles of 20 to 40 µm are dispersed in two types of modes.

In addition, the number of Ni particles that exist will change depending on the contained Ni amount, and in particular the number of Ni particles of 20 to 40 µm will decrease in proportion to the decrease in the additive amount of Ni.

Preferably, the Ni particles existing in the W matrix exist as WNi particles. Ni existing independently in the W matrix is undesirable since the magnetic properties of Ni will obstruct the generation of plasma in the sputtering process.

In particular, if the sintering temperature is low and the sintering is insufficient, the existing Ni particles will exist as Ni particles and considerably affect the sputtering efficiency. Accordingly, it could be said that the Ni particles existing in the W matrix desirably exist as WNi particles having non-magnetic properties.

Moreover, in order to perform sufficient sintering and cause the Ni particles to diffuse in W to obtain WNi particles, preferably, hot press is performed at 1300° C. to 1450° C. If the sintering temperature is less than 1300° C., the Ni particles will not diffuse sufficiently in W, and will exist as Ni particles. Diffusion can be sufficiently performed at 1300° C. or higher and 1450° C. (upper limit temperature) or less. If the hot press temperature exceeds 1450° C., Ni may melt since the melting point of Ni is 1455° C. Nevertheless, it is easier to increase the density and deoxidation tends to progress easier if the temperature is raised up to the vicinity of the melting point. Accordingly, the hot press temperature is preferably 1450° C. or less, and set to 1400° C. or less in consideration of safety.

With respect to the component composition of the sintered compact sputtering target, desirably, the purity is 4N5 or higher excluding gas components, W—Ni is what functions as the barrier film, and other impurities may contaminate the semiconductor film or the insulation film. Moreover, since the inclusion of impurities is likely to deform the target structure, and the foregoing favorable structure cannot be maintained, it is desirable to use a sputtering target with the highest purity as much as possible.

Desirably, as a gas component, oxygen is 1000 wtppm or less and carbon is 50 ppm or less. In particular, oxygen as a gas component is more preferably 500 wtppm or less. The reason for this is because gas components also cause the generation of particles. Specifically, films with a high content of oxygen and carbon have high film stress and peel easily. Thus, if these films adhere to the inside of the sputtering device, there is a problem in that the peeling of these films will cause a sudden increase in the generation of particles in the sputtering process.

Moreover, oxygen and carbon as gas components are likely to form oxides and carbides with the constituent elements. Thus, as with the foregoing explanation, the inclusion of foreign matter such as oxides and carbides will deform or partially destroy the favorable target structure of the present invention, and it could be said that the lower the content of such oxides and carbides, the better.

Nevertheless, the foregoing impurities will not cause a vital problem if contained in a normally included amount, and it should be understood that these impurities are not the crucial impediment of the target function. However, needless to say, the impurities should be reduced as much as possible for the foregoing reasons. The higher the relative density of the target, the easier it is to inhibit the generation of particles, and the relative density is 95.0% or higher, preferably 99.0% or higher, and more preferably 99.9% or higher. This is useful in increasing the value as a target. The reason why the pressure, sintering pressure, or welding pressure is set to 10 to 50 MPa in the sintering process is because the density cannot be improved as a matter of course if it is a low pressure of less than 10 MPa, and layered cracks are generated parallel to the pressed surface if a high pressure exceeding 50 MPa is applied.

EXAMPLES

Examples of the present invention are now explained. Note that these Examples are merely exemplifications and the present invention shall not be limited thereto. Specifically, the present invention covers all modes or modifications other than the Examples included in the scope of technical concept of the present invention.

Example 1

As the raw material powder, W powder had an average particle size of 5 μm and Ni powder had an average particle size of 30 μm, and these were blended to achieve W90Ni10 and mixed in a ball mill.

Subsequently, the mixed powder was filled in a carbon mold, heated to 1400° C. in a vacuum atmosphere and hot pressed at 30 MPa.

A sintered compact having a relative density of 100% was thereby obtained. Subsequently, the obtained sintered compact was subject to grinding and polishing treatment to prepare a target having a diameter of 330 mm and a thickness of 6.35 mm. Oxygen in the target was 120 wtppm and carbon was 30 wtppm.

The SEM image of this target is shown in FIG. 1. FIG. 1(a) is an SEM image of a W—Ni sintered compact surface (polished surface), FIG. 1(b) is a mapping image of W based on EDX (energy dispersion X-ray spectrometry) in the same visual field, and FIG. 1(c) is a mapping image of Ni based on EDX in the same visual field.

In leftmost FIG. 1(a), the W crystal structure can be observed. In FIG. 1(b) in the center and rightmost FIG. 1(c), fine Ni particles of 2 to 5 μm and large Ni particles of 20 to 40 μm dispersed in the W structure can be observed.

Subsequently, the sintered compact target processed as described above was bonded with a pure copper backing plate, and the target was set in a radio frequency (RF) sputtering device. Similarly, single crystal Si was set as the substrate to face the target.

In these conditions, RF sputtering was performed in an argon atmosphere, The applied voltage was RF 12 kW and the deposition time was 50 seconds.

A 15 nm barrier film was thereby formed on the single crystal silicon substrate. The generation status of particles in the foregoing process was observed.

Subsequently, 30 nm of copper was additionally deposited on the 15 nm barrier film, which was formed on the silicon substrate, via electroless plating. In order to confirm the performance of this barrier film, the silicon substrate to which the copper layer was formed via the barrier film was subject to vacuum anneal treatment at 350° C. for one hour, and the diffusion status of copper was checked based on AES depth profile measurement.

The results are summarized in Table 1. As shown in Table 1, no diffusion of copper to the single crystal silicon substrate could be acknowledged with the W90Ni10 thin film of Example 1, and the superior effect of the barrier layer was confirmed. Meanwhile, the electroless plating properties and adhesiveness of copper were not that favorable, however, they did not cause any considerable trouble. In addition, the generation of particles was extremely low and there was an additional feature that stable deposition of the barrier layer is possible.

TABLE 1

|  | Composition Ratio (at %) | Hot Press Temperature (° C.) | Relative Density (%) | Oxygen (wtppm) | Carbon (wtppm) | Barrier Property | Plating Property | Adhesiveness | Sputtering Characteristics |
|---|---|---|---|---|---|---|---|---|---|
| Example 1 | W90Ni10 | 1400 | 100 | 120 | 30 | ⊚ | Δ | Δ | ⊚ |
| Example 2 | W80Ni20 | 1400 | 99.9 | 100 | 30 | ⊚ | ⊚ | ⊚ | ⊚ |
| Example 3 | W70Ni30 | 1400 | 100 | 130 | 20 | ⊚ | ⊚ | ⊚ | ⊚ |
| Example 4 | W90Ni10 | 1400 | 96.1 | 850 | 30 | ⊚ | Δ | Δ | ○ |
| Example 5 | W80Ni20 | 1400 | 96.5 | 730 | 40 | ⊚ | ⊚ | ⊚ | ○ |

TABLE 1-continued

| | Composition Ratio (at %) | Hot Press Temperature (° C.) | Relative Density (%) | Oxygen (wtppm) | Carbon (wtppm) | Barrier Property | Plating Property | Adhesiveness | Sputtering Characteristics |
|---|---|---|---|---|---|---|---|---|---|
| Example 6 | W70Ni30 | 1400 | 97.3 | 870 | 30 | ◎ | ◎ | ◎ | ○ |
| Comparative Example 1 | W80Ni20 | 1200 | 87.1 | 900 | 20 | — | — | — | X |
| Comparative Example 2 | W80Ni20 | 1000 | 86.2 | 840 | 30 | — | — | — | X |
| Comparative Example 3 | W80Ni20 | 1200 | 83.4 | 1340 | 40 | — | — | — | X |
| Comparative Example 4 | W70Ni30 | 1000 | 85.8 | 1200 | 30 | — | — | — | X |

Example 2

As the raw material powder, W powder had an average particle size of 5 μm and Ni powder had an average particle size of 30 μm, and these were blended to achieve W80Ni20 and mixed in a ball mill.

Subsequently, the mixed powder was filled in a carbon mold, heated to 1400° C. in a vacuum atmosphere and hot pressed at 30 MPa.

A sintered compact having a relative density of 99.9% was thereby obtained. Subsequently, the obtained sintered compact was subject to grinding and polishing treatment to prepare a target having a diameter of 330 mm and a thickness of 6.35 mm. Oxygen in the target was 100 wtppm and carbon was 30 wtppm.

Figure 2:
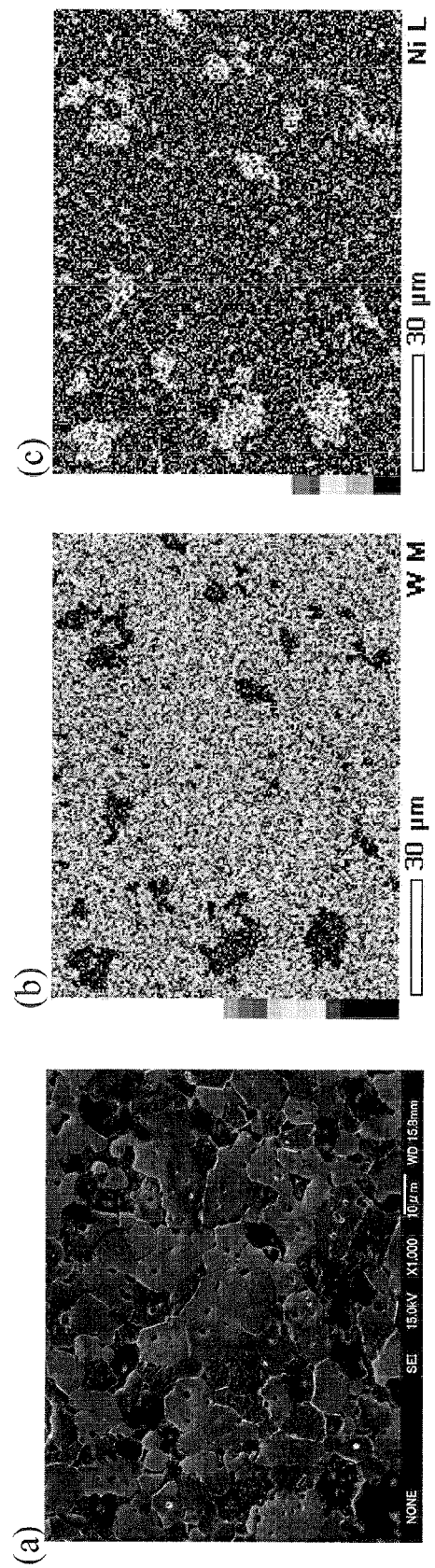
FIG. 2 SEM image of a W-20 at % Ni target surface, wherein (a) is an SEM image of a W—Ni sintered compact surface (polished surface), (b) is a mapping image of W based on EDX (energy dispersion X-ray spectrometry) in the same visual field, and (c) is a mapping image of Ni based on EDX in the same visual field.

The SEM image of this target is shown in FIG. 2. FIG. 2(a) is an SEM image of a W—Ni sintered compact surface (polished surface), FIG. 2(b) is a mapping image of W based on EDX (energy dispersion X-ray spectrometry) in the same visual field, and FIG. 2(c) is a mapping image of Ni based on EDX in the same visual field.

In FIG. 2(b) in the center and FIG. 2(c) on the right, fine Ni particles of 2 to 5 μm and large Ni particles of 20 to 40 μm dispersed in the W structure can be observed.

The number of large Ni particles of 20 to 40 μm shown in FIG. 2 of Example 2 has increased compared to the number of large Ni particles of 20 to 40 μm shown in FIG. 1 of Example 1.

Subsequently, the sintered compact target processed as described above was bonded with a pure copper backing plate, and the target was set in a radio frequency (RF) sputtering device. Similarly, single crystal Si was set as the substrate to face the target.

In these conditions, RF sputtering was performed in an argon atmosphere. The applied voltage was RF 12 kW and the deposition time was 50 seconds.

A 15 nm barrier film was thereby formed on the single crystal silicon substrate. The generation status of particles in the foregoing process was observed.

Subsequently, 30 nm of copper was additionally deposited on the 15 nm barrier film, which was formed on the silicon substrate, via electroless plating. In order to confirm the performance of this barrier film, the silicon substrate to which the copper layer was formed via the barrier film was subject to vacuum anneal treatment at 350° C. for one hour, and the diffusion status of copper was checked based on AES depth profile measurement.

The results are summarized in Table 1. As shown in Table 1, no diffusion of copper to the single crystal silicon substrate could be acknowledged with the W80Ni20 thin film of Example 2, and the superior effect of the barrier layer was confirmed. Meanwhile, the electroless plating properties and adhesiveness of copper were both favorable. Besides the generation of particles was extremely low, there was an additional feature that stable deposition of the barrier layer is possible.

Example 3

As the raw material powder, W powder had an average particle size of 5 μm and Ni powder had an average particle size of 30 μm, and these were blended to achieve W70Ni30 and mixed in a ball mill.

Subsequently, the mixed powder was filled in a carbon mold, heated to 1400° C. in a vacuum atmosphere and hot pressed at 30 MPa.

A sintered compact having a relative density of 100% was thereby obtained. Subsequently, the obtained sintered compact was subject to grinding and polishing treatment to prepare a target having a diameter of 330 mm and a thickness of 6.35 mm. Oxygen in the target was 130 wtppm and carbon was 20 wtppm.

Figure 3:
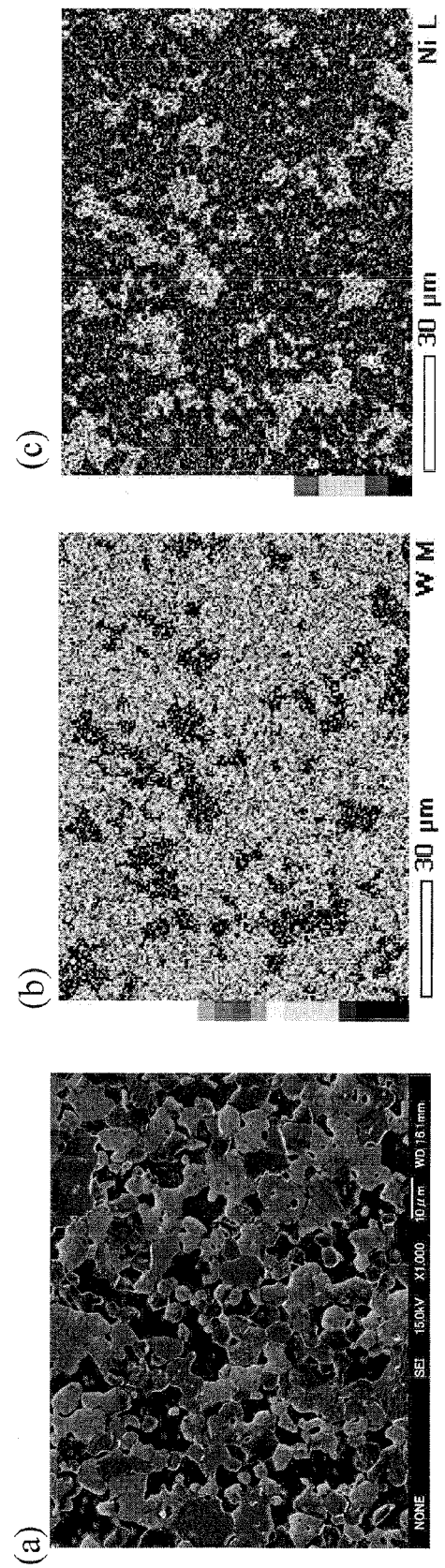
FIG. 3 SEM image of a W-30 at % Ni target surface, wherein (a) is an SEM image of a W—Ni sintered compact surface (polished surface), (b) is a mapping image of W based on EDX (energy dispersion X-ray spectrometry) in the same visual field, and (c) is a mapping image of Ni based on EDX in the same visual field.

The SEM image of this target is shown in FIG. 3. FIG. 3(a) is an SEM image of a W—Ni sintered compact surface (polished surface), FIG. 3(b) is a mapping image of W based on EDX (energy dispersion X-ray spectrometry) in the same visual 1.0 field, and FIG. 3(c) is a mapping image of Ni based on EDX in the same visual field.

In FIG. 3(b) in the center and FIG. 3(c) on the right, fine Ni particles of 2 to 5 μm and large Ni particles of 20 to 40 μm dispersed in the W structure can be observed.

The number of large Ni particles of 20 to 40 μm shown in FIG. 3 of Example 3 has increased compared to the number of large Ni particles of 20 to 40 μm shown in FIG. 2 of Example 2.

Subsequently, the sintered compact target processed as described above was bonded with a pure copper backing plate, and the target was set in a radio frequency (RF) sputtering device. Similarly, single crystal Si was set as the substrate to face the target.

In these conditions, RF sputtering was performed in an argon atmosphere. The applied voltage was RF 12 kW and the deposition time was 50 seconds.

A 15 nm barrier film was thereby formed on the single crystal silicon substrate. The generation status of particles in the foregoing process was observed.

Subsequently, 30 nm of copper was additionally deposited on the 15 nm barrier film, which was formed on the silicon substrate, via electroless plating. In order to confirm the performance of this barrier film, the silicon substrate to which the copper layer was formed via the barrier film was subject to vacuum anneal treatment at 350° C. for one hour, and the diffusion status of copper was checked based on AES depth profile measurement.

The results are summarized in Table 1. As shown in Table 1, no diffusion of copper to the single crystal silicon substrate could be acknowledged with the W70Ni30 thin film of Example 3, and the superior effect of the barrier layer was confirmed. Meanwhile, the electroless plating properties and adhesiveness of copper were both favorable. And, the generation of particles was extremely low and there was an additional feature that stable deposition of the barrier layer is possible.

Figure 4:
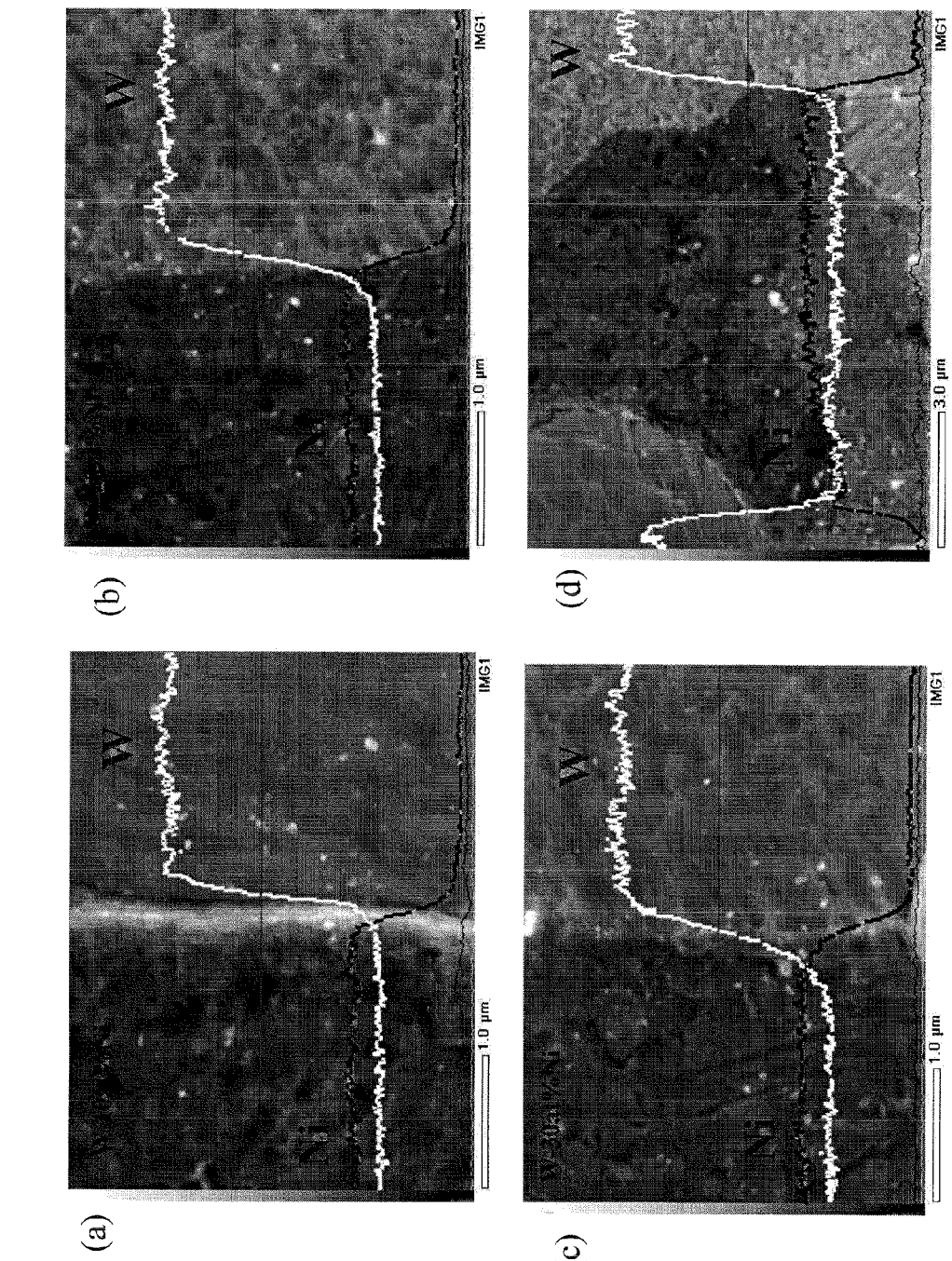
FIG. 4 The obtained line spectrum upon observing the interface of the W-rich particles in (a) the W-10 at % Ni target, (b) the W-20 at % Ni target, and (c) the W-30 at % Ni target, respectively, and the obtained line spectrum of the Ni-rich particles in (d) the W-20 at % Ni.

The SEM image of the interface of W and Ni particles of Examples 1 to 3 is shown in FIG. 4. FIG. 4 shows the obtained line spectrum upon observing the interface of the W-rich particles in (a) the W-10 at % Ni target, (b) the W-20 at % Ni target, and (c) the W-30 at % Ni target, respectively. In FIG. 4(a) to (c), it was confirmed that Ni is hardly diffused in the W-rich particles and W is diffused in the Ni-rich particles.

FIG. 4(d) at the lower right part is a result of performing heat treatment at 1400° C. for two hours, and it was confirmed that W is diffused in Ni.

Data confirming the existence of W and NiW in the W-10 at % Ni target, the W-20 at % Ni target, and the VV-30 at % Ni target based on XRD measurement is shown in FIG. 5(a) to (c).

Figure 5:
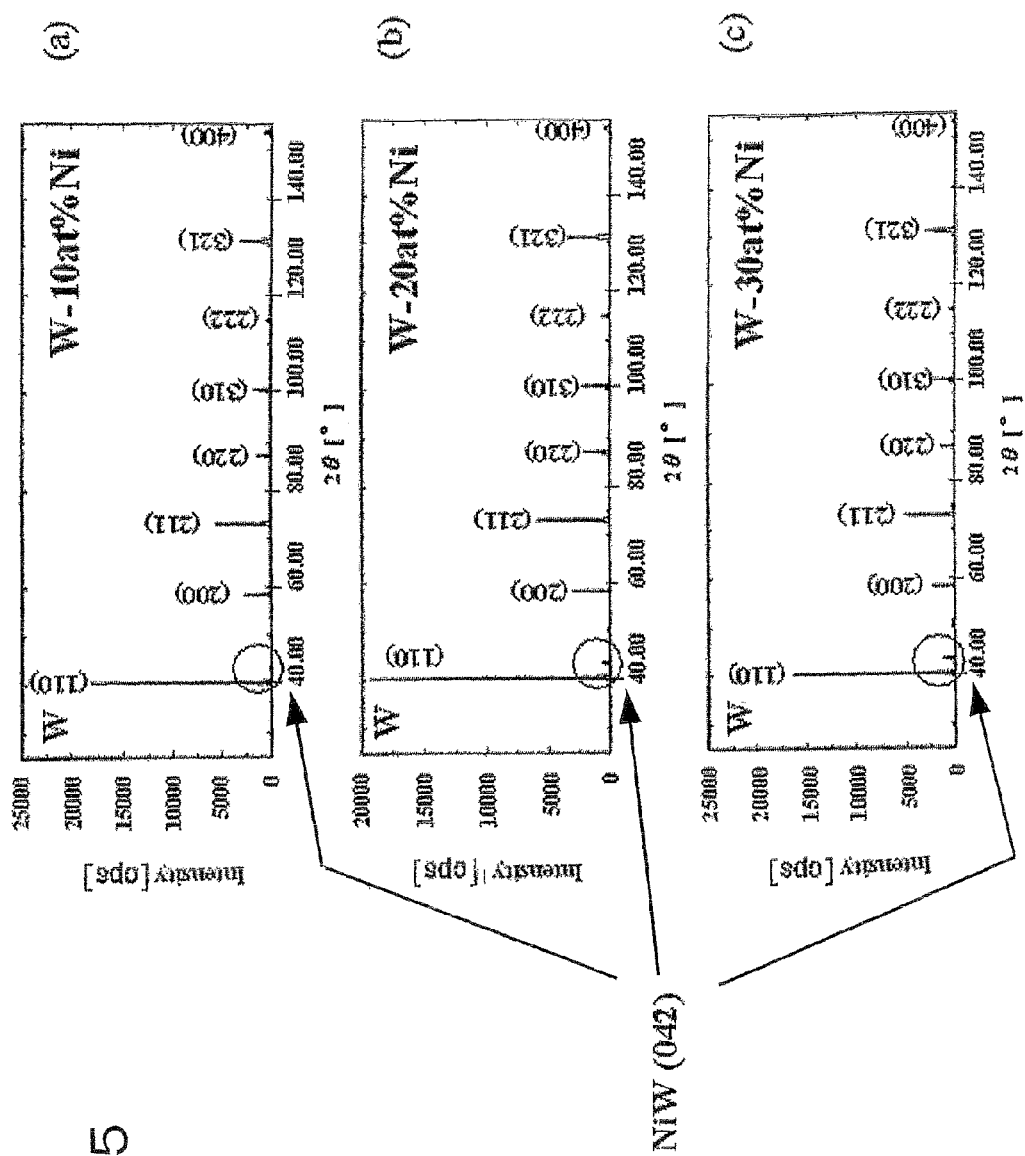
FIG. 5 A diagram showing the W peak (110) and the NiW (042) peak of the W-10 at % Ni target (a), the W-20 at % Ni target (b), and the W-30 at % Ni target (c) based on XRD measurement.

In FIG. 5(a) to (c), NiW (042) is the main peak of NiW, and the peak intensity is increasing pursuant to the increase in the additive amount of Ni. Thus, it is evident that W is diffused in the Ni particles and an intermetallic compound of NiW is formed. Moreover, in FIG. 5, the peak of Ni could not be confirmed, and it was confirmed that Ni does not exist independently in the target.

Example 4

As the raw material powder, W powder had an average particle size of 1 μm and Ni powder had an average particle size of 1 μm, and these were blended to achieve W90Ni10 and mixed in a ball mill.

Subsequently, the mixed powder was filled in a carbon mold, heated to 1400° C. in a vacuum atmosphere and hot pressed at 30 MPa.

A sintered compact having a relative density of 96.1% was thereby obtained. Subsequently, the obtained sintered compact was subject to grinding and polishing treatment to prepare a target having a diameter of 330 mm and a thickness of 6.35 mm. Oxygen in the target was 850 wtppm and carbon was 30 wtppm. The amount of oxygen in the target increased compared to Example 1, and the increase in the adsorbed amount of oxygen is considered to be because the used raw material powder was fine.

Although the SEM image of this target is omitted, similar to the SEM image shown in FIG. 1 of Example 1, fine Ni particles of 2 to 5 μm and large Ni particles of 20 to 40 μm dispersed in the W structure can be observed.

Subsequently, the sintered compact target processed as described above was bonded with a pure copper backing plate, and the target was set in a radio frequency (RF) sputtering device. Similarly, single crystal Si was set as the substrate to face the target.

In these conditions, RF sputtering was performed in an argon atmosphere. The applied voltage was RF 12 kW and the deposition time was 50 seconds. A 15 nm barrier film was thereby formed on the single crystal silicon substrate. The generation status of particles in the foregoing process was observed.

Subsequently, 30 nm of copper was additionally deposited on the 15 nm barrier film, which was formed on the silicon substrate, via electroless plating. In order to confirm the performance of this barrier film, the silicon substrate to which the copper layer was formed via the barrier film was subject to vacuum anneal treatment at 350° C. for one hour, and the diffusion status of copper was checked based on AES depth profile measurement.

The results are summarized in Table 1. As shown in Table 1, no diffusion of copper to the single crystal silicon substrate could be acknowledged with the W90Ni10 thin film of Example 4, and the superior effect of the barrier layer was confirmed. Meanwhile, the electroless plating properties and adhesiveness of copper were slightly inferior. In addition, the generation of particles was also acknowledged a little, but was not of a problematic level.

The reason why the electroless plating properties and adhesiveness deteriorated and the generation of particles increased caused by the slightly low density of the target are considered to be due to the increase in the oxygen amount, but it was not of a problematic level.

Example 5

As the raw material powder, W powder had an average particle size of 1 μm and Ni powder had an average particle size of 1 μm, and these were blended to achieve W80Ni20 and mixed in a ball mill.

Subsequently, the mixed powder was filled in a carbon mold, heated to 1400° C. in a vacuum atmosphere and hot pressed at 30 MPa.

A sintered compact having a relative density of 96.5% was thereby obtained. Subsequently, the obtained sintered compact was subject to grinding and polishing treatment to prepare a target having a diameter of 330 mm and a thickness of 6.35 mm. Oxygen in the target was 730 wtppm and carbon was 40 wtppm. The amount of oxygen in the target increased compared to Example 2, and the increase in the adsorbed amount of oxygen is considered to be because the used raw material powder was fine.

Although the SEM image of this target is omitted, similar to the SEM image shown in FIG. 2 of Example 2, fine Ni particles of 2 to 5 μm and large Ni particles of 20 to 40 μm dispersed in the W structure can be observed.

Subsequently, the sintered compact target processed as described above was bonded with a pure copper backing plate, and the target was set in a radio frequency (RF) sputtering device. Similarly, single crystal Si was set as the substrate to face the target.

In these conditions, RF sputtering was performed in an argon atmosphere. The applied voltage was RF 12 kW and the deposition time was 50 seconds. A 15 nm barrier film was thereby formed on the single crystal silicon substrate. The generation status of particles in the foregoing process was observed.

Subsequently, 30 nm of copper was additionally deposited on the 15 nm barrier film, which was formed on the silicon substrate, via electroless plating. In order to confirm the performance of this barrier film, the silicon substrate to which the copper layer was formed via the barrier film was subject to vacuum anneal treatment at 350° C. for one hour, and the diffusion status of copper was checked based on AES depth profile measurement.

The results are summarized in Table 1. As shown in Table 1, no diffusion of copper to the single crystal silicon substrate could be acknowledged with the W80Ni20 thin film of Example 5, and the superior effect of the barrier layer was confirmed. Meanwhile, the electroless plating properties and adhesiveness of copper were slightly inferior. In addition, the generation of particles was also acknowledged a little, but was not of a problematic level.

The reason why the generation of particles slightly increased is considered to be due to the increase in the oxygen amount, but it was not of a problematic level.

Example 6

As the raw material powder, W powder had an average particle size of 1 μm and Ni powder had an average particle size of 1 μm, and these were blended to achieve W70Ni30 and mixed in a ball mill.

Subsequently, the mixed powder was filled in a carbon mold, heated to 1400° C. in a vacuum atmosphere and hot pressed at 30 MPa.

A sintered compact having a relative density of 97.3% was thereby obtained. Subsequently, the obtained sintered compact was subject to grinding and polishing treatment to prepare a target having a diameter of 330 mm and a thickness of 6.35 mm. Oxygen in the target was 730 wtppm and carbon was 40 wtppm. The amount of oxygen in the target increased compared to Example 3, and the increase in the adsorbed amount of oxygen is considered to be because the used raw material powder was fine.

Although the SEM image of this target is omitted, similar to the SEM image shown in FIG. 3 of Example 3, fine Ni particles of 2 to 5 μm and large Ni particles of 20 to 40 μm dispersed in the W structure can be observed.

Subsequently, the sintered compact target processed as described above was bonded with a pure copper backing plate, and the target was set in a radio frequency (RF) sputtering device. Similarly, single crystal Si was set as the substrate to face the target.

In these conditions, RF sputtering was performed in an argon atmosphere. The applied voltage was RF 12 kW and the deposition time was 50 seconds. A 15 nm barrier film was thereby formed on the single crystal silicon substrate. The generation status of particles in the foregoing process was observed.

Subsequently, 30 nm of copper was additionally deposited on the 15 nm barrier film, which was formed on the silicon substrate, via electroless plating. In order to confirm the performance of this barrier film, the silicon substrate to which the copper layer was formed via the barrier film was subject to vacuum anneal treatment at 350° C. for one hour, and the diffusion status of copper was checked based on AES depth profile measurement.

The results are summarized in Table 1. As shown in Table 1, no diffusion of copper to the single crystal silicon substrate could be acknowledged with the W70Ni30 thin film of Example 6, and the superior effect of the barrier layer was confirmed. Meanwhile, the electroless plating properties and adhesiveness of copper were slightly inferior. In addition, the generation of particles was also acknowledged a little, but was not of a problematic level.

The reason why the generation of particles slightly increased is considered to be due to the increase in the oxygen amount, but it was not of a problematic level.

Comparative Example 1

As the raw material powder, W powder had an average particle size of 5 μm and Ni powder had an average particle size of 30 μm, and these were blended to achieve W80Ni20 and mixed in a ball mill.

Subsequently, the mixed powder was filled in a carbon mold, heated to 1200° C. in a vacuum atmosphere and hot pressed at 30 MPa.

A sintered compact having a relative density of 87.1% was thereby obtained. Subsequently, the obtained sintered compact was subject to grinding and polishing treatment to prepare a target having a diameter of 330 mm and a thickness of 6.35 mm. Oxygen in the target was 900 wtppm and carbon was 20 wtppm.

Subsequently, the sintered compact target processed as described above was bonded with a pure copper backing plate, and the target was set in a radio frequency (RF) sputtering device. Similarly, single crystal Si was set as the substrate to face the target.

In these conditions, RF sputtering was performed in an argon atmosphere. The applied voltage was RF 12 kW and the deposition time was 50 seconds. Nevertheless, plasma could not be generated and the sputter properties were inferior. The reason for this is considered to be that, because the hot press temperature was low, W did not sufficiently diffuse in the Ni particles of the target and existed as pure Ni particles, and plasma was not generated in the sputtering process due to the magnetic properties of the Ni particles.

Although sputtering was forcefully performed, a considerable amount of particles was generated due to the low density. It was found that it is difficult to perform uniform deposition in the condition.

It would be meaningless to observe the barrier properties, plating properties, and adhesiveness of the plated film in the existing conditions, so subsequent research was not conducted. The results are shown in Table 1.

Comparative Example 2

As the raw material powder, W powder had an average particle size of 5 μm and Ni powder had an average particle size of 30 μm, and these were blended to achieve W80Ni20 and mixed in a ball mill.

Subsequently, the mixed powder was filled in a carbon mold, heated to 1000° C. in a vacuum atmosphere and hot pressed at 30 MPa.

A sintered compact having a relative density of 86.2% was thereby obtained. Subsequently, the obtained sintered compact was subject to grinding and polishing treatment to prepare a target having a diameter of 330 mm and a thickness of 6.35 mm. Oxygen in the target was 840 wtppm and carbon was 30 wtppm.

Subsequently, the sintered compact target processed as described above was bonded with a pure copper backing plate, and the target was set in a radio frequency (RF) sputtering device. Similarly, single crystal Si was set as the substrate to face the target.

In these conditions, RF sputtering was performed in an argon atmosphere. The applied voltage was RF 12 kW and the deposition time was 50 seconds. Nevertheless, as with Comparative Example 1, plasma could not be generated and the sputter properties were inferior. The reason for this is considered to be that the hot press temperature was low, W did not sufficiently diffuse in the Ni particles of the target and existed as pure Ni particles, and plasma was not generated in the sputtering process due to the magnetic properties of the Ni particles.

Although sputtering was forcefully performed, a considerable amount of particles was generated due to the low density. It was found that it is difficult to perform uniform deposition in the condition.

It would be meaningless to observe the barrier properties, plating properties, and adhesiveness of the plated film in the existing conditions, so subsequent research was not conducted. The results are shown in Table 1.

Comparative Example 3

As the raw material powder, W powder had an average particle size of 1 μm and Ni powder had an average particle size of 1 μm, and these were blended to achieve W80Ni20 and mixed in a ball mill.

Subsequently, the mixed powder was filled in a carbon mold, heated to 1200° C. in a vacuum atmosphere and hot pressed at 30 MPa. Since the raw material powder was fine, the amount of oxygen increased much more.

A sintered compact having a relative density of 83.4% was thereby obtained. Subsequently, the obtained sintered compact was subject to grinding and polishing treatment to prepare a target having a diameter of 330 mm and a thickness of 6.35 mm. Oxygen in the target was 1340 wtppm and carbon was 40 wtppm. Since the raw material powder was fine, the amount of oxygen increased much more.

Subsequently, the sintered compact target processed as described above was bonded with a pure copper backing plate, and the target was set in a radio frequency (RF) sputtering device. Similarly, single crystal Si was set as the substrate to face the target.

In these conditions, RF sputtering was performed in an argon atmosphere. The applied voltage was RF 12 kW and the deposition time was 50 seconds. Nevertheless, as with Comparative Example 1, plasma could not be generated and the sputter properties were inferior. The reason for this is considered to be that, because the hot press temperature was low, W did not sufficiently diffuse in the Ni particles of the target and existed as pure Ni particles, and plasma was not generated in the sputtering process due to the magnetic properties of the Ni particles.

Although sputtering was forcefully performed, a considerable amount of particles was generated due to the low density. It was found that it is difficult to perform uniform deposition in the condition.

It would be meaningless to observe the barrier properties, plating properties, and adhesiveness of the plated film in the existing conditions, subsequent research was not conducted. The results are shown in Table 1.

Comparative Example 4

As the raw material powder, W powder had an average particle size of 1 μm and Ni powder had an average particle size of 1 μm, and these were blended to achieve W70Ni30 and mixed in a ball mill.

Subsequently, the mixed powder was filled in a carbon mold, heated to 1000° C. in a vacuum atmosphere and hot pressed at 30 MPa.

A sintered compact having a relative density of 85.8% was thereby obtained. Subsequently, the obtained sintered compact was subject to grinding and polishing treatment to prepare a target having a diameter of 330 mm and a thickness of 6.35 mm. Oxygen in the target was 1200 wtppm and carbon was 30 wtppm. Since the raw material powder was fine, the amount of oxygen increased much more.

Subsequently, the sintered compact target processed as described above was bonded with a pure copper backing plate, and the target was set in a radio frequency (RF) sputtering device. Similarly, single crystal Si was set as the substrate to face the target.

In these conditions, RF sputtering was performed in an argon atmosphere. The applied voltage was RF 12 kW and the deposition time was 50 seconds. Nevertheless, as with Comparative Example 1, plasma could not be generated and the sputter properties were inferior. The reason for this is considered to be that, because the hot press temperature was low, W did not sufficiently diffuse in the Ni particles of the target and existed as pure Ni particles, and plasma was not generated in the sputtering process due to the magnetic properties of the Ni particles.

Although sputtering was forcefully performed, a considerable amount of particles was generated due to the low density. It was found that it is difficult to perform uniform deposition in the condition.

It would be meaningless to observe the barrier properties, plating properties, and adhesiveness of the plated film in the existing conditions, so subsequent research was not conducted. The results are shown in Table 1.

As evident from the foregoing Examples and Comparative Examples, the sintered compact sputtering target for forming the barrier film for a semiconductor wiring of the present invention contains Ni with its remainder being W and unavoidable impurities and has the composition of $W_xNi_y$ ($70 \leq x \leq 90$, $10 \leq y \leq 30$), which is essential as barrier film for a semiconductor wiring for a semiconductor. In addition, it is important to comprise a target structure configured from a W matrix and Ni particles existing therein and in which W is diffused in the Ni particles.

This target yields favorable sputtering characteristics with generation of few particles, and comprises a material quality of a favorable target.

In addition, as a result of sputtering this target, it is possible to form a film having a composition of $W_xNi_y$ ($70 \leq x \leq 90$, $10 \leq y \leq 30$), and this film is significantly superior as a barrier film for a semiconductor wiring and also yields superior plating properties and plating adhesiveness.

INDUSTRIAL APPLICABILITY

Since the present invention yields a superior effect of being able to obtain a sputtering target which is effective for use in forming a barrier film without depending on the nitriding reaction in the sputtering process, which is capable of effectively preventing the reaction between layers in a semiconductor device, and which is free from the generation of particles in the sputtering process, as well as a method of producing such a target and the foregoing barrier film, the present invention is useful as a constituent material of a semiconductor device.

The invention claimed is:

1. A sintered compact sputtering target for forming a barrier film for a semiconductor wiring consisting of Ni, W and unavoidable impurities, having a composition of $W_xNi_y$ (70 at %≤x≤90 at %, 10 at %≤y≤30 at %), and comprising a target structure configured from a W matrix and Ni particles dispersed therein, the Ni particles containing W diffused from the W matrix, existing as WNi particles, and having a size of 2 to 40 μm.

2. The sintered compact sputtering target according to claim 1, wherein the Ni particles containing W and dispersed in the W matrix are of sizes of 2 to 5 μm and 20 to 40 μm.

3. The sintered compact sputtering target according to claim 1, wherein the sintered compact sputtering target has a purity of 4N5 or higher excluding gas components.

4. The sintered compact sputtering target according to claim 3, wherein a content of oxygen as a gas component is 1000 wtppm or less and a content of carbon as a gas component is 50 ppm or less.

5. The sintered compact sputtering target according to claim 4, wherein a content of oxygen as a gas component is 500 wtppm or less.

6. The sintered compact sputtering target according to claim 1, wherein the sintered compact sputtering target has a relative density of 95.0% or higher.

7. The sintered compact sputtering target according to claim 1, wherein y in the composition WxNiy is 20 to 30 at %.

8. A sputtering target for forming a barrier film for a semiconductor wiring, comprising a sintered compact of Ni and W and having a composition of WxNiy (70 at %≤x≤90 at %, 10 at %≤y≤30 at %), the sintered compact having a structure including WNi particles of 2 to 40 μm dispersed in a W matrix.

9. The sputtering target according to claim 8, wherein the WNi particles are of sizes consisting of 2 to 5 μm and 20 to 40 μm.

10. The sputtering target according to claim 8, wherein the sintered compact has a relative density of 95.0% or higher.

11. The sputtering target according to claim 8, wherein y in the composition WxNiy is 20 to 30 at %.

12. The sputtering target according to claim 10, wherein the relative density is 99.9% or higher.

13. The sputtering target according to claim 6, wherein the relative density is 99.0% or higher.

14. A method of producing a sputtering target, wherein W powder having an average particle size of 1 to 5 μm and Ni powder having an average particle size of 1 to 30 μm are mixed to achieve a compounding ratio of WxNiy (70 at %≤x≤90 at %, 10 at %≤y≤30 at %), and this is sintered based on hot press at a welding pressure of 10 to 50 MPa to produce a sputtering target having a composition of WxNiy (70 at %≤x≤90 at %, 10 at %≤y≤30 at %) and a target structure configured from a W matrix and Ni particles existing therein and in which W is diffused in the Ni particles, wherein the Ni particles existing in the W matrix are WNi particles of 2 to 40 μm dispersed in the W matrix.

* * * * *